(12) United States Patent
Hirakata et al.

(10) Patent No.: US 10,636,999 B2
(45) Date of Patent: Apr. 28, 2020

(54) LAMINATE AND IMAGE DISPLAY DEVICE

(71) Applicant: FUJIFILM Corporation, Tokyo (JP)

(72) Inventors: Junichi Hirakata, Kanagawa (JP); Yuya Hamaguchi, Kanagawa (JP)

(73) Assignee: FUJIFILM Corporation, Tokyo (JP)

(*) Notice: Subject to any disclaimer, the term of this patent is extended or adjusted under 35 U.S.C. 154(b) by 0 days.

(21) Appl. No.: 15/652,851

(22) Filed: Jul. 18, 2017

(65) Prior Publication Data

US 2017/0317313 A1 Nov. 2, 2017

Related U.S. Application Data

(63) Continuation of application No. PCT/JP2016/053085, filed on Feb. 2, 2016.

(30) Foreign Application Priority Data

Feb. 4, 2015 (JP) .................. 2015-020751

(51) Int. Cl.
| | |
|---|---|
| *H01L 51/52* | (2006.01) |
| *B32B 7/02* | (2019.01) |
| *G09F 9/30* | (2006.01) |
| *B32B 9/00* | (2006.01) |
| *G02B 5/30* | (2006.01) |

(Continued)

(52) U.S. Cl.
CPC ............ *H01L 51/5253* (2013.01); *B32B 7/02* (2013.01); *B32B 9/00* (2013.01); *B32B 9/04* (2013.01); *G02B 5/3016* (2013.01); *G02B 5/3083* (2013.01); *G09F 9/30* (2013.01); *H01L 51/5281* (2013.01); *B32B 2307/42* (2013.01); *H01L 27/3241* (2013.01)

(58) Field of Classification Search
None
See application file for complete search history.

(56) References Cited

U.S. PATENT DOCUMENTS

| | | | |
|---|---|---|---|
| 8,531,765 B2 | 9/2013 | Sakai et al. | |
| 2008/0079878 A1* | 4/2008 | Sugiyama | ......... G02F 1/133634 |
| | | | 349/119 |

(Continued)

FOREIGN PATENT DOCUMENTS

| | | |
|---|---|---|
| JP | H02-022625 A | 1/1990 |
| JP | 2001-083489 A | 3/2001 |

(Continued)

OTHER PUBLICATIONS

Kawamoto et al. JP2007148097A, Jun. 14, 2007, Nitto Denko Corporation, pp. 1-31, English Translation.*

(Continued)

*Primary Examiner* — Shaun M Campbell
(74) *Attorney, Agent, or Firm* — Edwards Neils LLC; Jean C. Edwards, Esq.

(57) ABSTRACT

An object of the invention is to provide a novel laminate and a novel image display device which have both of a gas barrier function and a circular polarization conversion function and have a reduced thickness as compared to those in the related art. A laminate of the invention has a substrate, an inorganic layer, an alignment film, and an organic layer in this order, and the organic layer contains a liquid crystal compound.

6 Claims, 2 Drawing Sheets

(51) Int. Cl.
*B32B 9/04* (2006.01)
*H01L 27/32* (2006.01)

(56) References Cited

U.S. PATENT DOCUMENTS

| | | | |
|---|---|---|---|
| 2008/0199637 A1* | 8/2008 | Ushiyama | C08L 1/10 428/1.31 |
| 2009/0072230 A1* | 3/2009 | Ito | C23C 16/30 257/40 |
| 2011/0052892 A1 | 3/2011 | Murakami | |
| 2011/0058127 A1 | 3/2011 | Toyooka | |
| 2011/0222155 A1 | 9/2011 | Sakai et al. | |
| 2013/0032830 A1* | 2/2013 | Lee | G02B 5/3041 257/88 |
| 2016/0170110 A1* | 6/2016 | Pau | G02B 5/3016 |
| 2017/0187004 A1* | 6/2017 | Giraldo | H01L 51/5253 |

FOREIGN PATENT DOCUMENTS

| | | |
|---|---|---|
| JP | 2005-189393 A | 7/2005 |
| JP | 2006-330522 A | 12/2006 |
| JP | 2007-148097 A | 6/2007 |
| JP | 2007-156234 A | 6/2007 |
| JP | 2009-251288 A | 10/2009 |
| JP | 2010-231198 A | 10/2010 |
| JP | 2011-051220 A | 3/2011 |
| JP | 2011-209390 A | 10/2011 |
| JP | 2011-237513 A | 11/2011 |
| JP | 2012-032418 A | 2/2012 |
| JP | 2012-220554 A | 11/2012 |
| JP | 2013-200452 A | 10/2013 |
| JP | 2015-007764 A | 1/2015 |

OTHER PUBLICATIONS

International Preliminary Report on Patentability issued by WIPO dated Aug. 17, 2017, in connection with International Patent Application No. PCT/JP2016/053085.
International Search Report issued in PCT/JP2016/053085 dated Mar. 15, 2016.
Written Opinion issued in PCT/JP2016/053085 dated Mar. 15, 2016.
Notification of Reasons for Refusal issued by the Japanese Patent Office dated May 8, 2018 in connection with Japanese Patent Application No. 2016-573382.
Notification of Reasons for Refusal issued by the Japanese Patent Office dated Nov. 6, 2018, in connection with Japanese Patent Application No. 2016-573382.
Notification of Reasons for Refusal issued by the Japanese Patent Office dated Apr. 9, 2019, in connection with Japanese Patent Application No. 2016-573382.

* cited by examiner

LAMINATE AND IMAGE DISPLAY DEVICE

CROSS-REFERENCE TO RELATED APPLICATIONS

This application is a Continuation of PCT International Application No. PCT/JP2016/053085 filed on Feb. 2, 2016, which was published under PCT Article 21(2) in Japanese, and which claims priority under 35 U.S.C. § 119(a) to Japanese Patent Application No. 2015-020751 filed on Feb. 4, 2015. The above applications are hereby expressly incorporated by reference, in their entirety, into the present application.

BACKGROUND OF THE INVENTION

1. Field of the Invention

The present invention relates to a laminate and an image display device.

2. Description of the Related Art

Various types of plastics have been examined as a substitute for glass substrates of devices such as liquid crystal display elements and organic electroluminescence (EL) display elements.

Here, plastic is poorer in gas barrier property for shielding oxygen and water vapor than glass. Accordingly, in a case where plastic is used as a substitute for a glass substrate, a gas barrier film for sealing may be used in combination.

As such a gas barrier film, a gas barrier film having a base film, an organic layer, and an inorganic layer is considered (for example, JP2011-51220A).

In recent years, the use of devices (for example, smartphones) which are equipped with an image display device and are usable outdoors has been increasing. With this, a reduction in display quality due to the reflection of outdoor daylight in an image display device has occurred.

Regarding the problem, technologies for suppressing the reflection of outdoor daylight using a circular polarizing plate having a polarization conversion function have been proposed (for example, JP2012-32418A).

SUMMARY OF THE INVENTION

The inventors have thought that a further reduction in thickness is required because in a case where a gas barrier film is used for sealing and a circular polarizing plate is used for suppressing the reflection of outdoor daylight, the total number of layers is increased and the thickness of a display device increases.

An object of the invention is to provide a novel laminate and a novel image display device which have both of a gas barrier function and a polarization conversion function and have a reduced thickness as compared to those in the related art.

The inventors have focused on an organic layer of a usual gas barrier film having a laminate of an organic layer and an inorganic layer.

Here, in the gas barrier film having a laminate of an organic layer and an inorganic layer, the gas barrier property for shielding oxygen and water vapor is almost achieved by the inorganic layer, and the organic layer rarely contributes to the gas barrier property and functions as a spacer.

That is, the inventors have thought that the entire thicknesses of a laminate and an image display device can be reduced by adding a function to the organic layer.

In an image display device, a circular polarizing plate having a polarization conversion function is used for suppressing the reflection of outdoor daylight as described above, and in some cases, a layer including a liquid crystal compound is used as a layer having a polarization conversion function. As the layer including a liquid crystal compound, a layer obtained by polymerizing and curing a monomer is used as in a case of an organic layer for use in a gas barrier film.

The inventors have found that in a case where an organic layer in a gas barrier film is produced using an organic layer including a liquid crystal compound, the polarization conversion function can be integrated into the gas barrier film and the entire thicknesses of a laminate and an image display device can be reduced.

That is, the inventors have found that the above-described object can be achieved by the following configurations.

[1] A laminate comprising, in the following order: a substrate; an inorganic layer; an alignment film; and an organic layer, in which the organic layer contains a liquid crystal compound.

[2] The laminate according to [1], in which the inorganic layer contains at least one inorganic compound selected from the group consisting of silicon nitride, silicon oxide, silicon oxynitride, and aluminum oxide.

[3] The laminate according to [1] or [2], further comprising: a polarizer which is provided on a side of the substrate opposite to the inorganic layer.

[4] The laminate according to [3], in which the substrate substantially has no in-plane retardation, and the organic layer is a $\lambda/4$ plate.

[5] The laminate according to [3], in which the substrate has an in-plane retardation, and the organic layer is $\lambda/4$ plate, and an angle formed between a slow axis direction of the substrate and an absorption axis direction or a transmission axis direction of the polarizer is $-5°$ to $+5°$.

[6] The laminate according to [3], in which the substrate is a $\lambda/2$ plate, and the organic layer is $\lambda/4$ plate.

[7] The laminate according to [3], in which the substrate is a $\lambda/4$ plate, and the organic layer is a positive C-plate.

[8] The laminate according to [1] or [2], further comprising: a polarizer which is provided between the substrate and the organic layer, in which the organic layer is $\lambda/4$ plate.

[9] An image display device comprising, in the following order from a visible side: a sealing material; and an image display element, in which the sealing material is the laminate according to any one of claims 1 to 8.

[10] The image display device according to [9], in which the sealing material is a laminate in which the substrate is disposed on the visible side.

[11] The image display device according to [9], in which the sealing material is a laminate in which the substrate is disposed on the image display element side.

[12] The image display device according to any one of [9] to [11], in which the image display element is an EL display element.

[13] The image display device according to [12], in which the EL display element is an organic EL display element.

According to the invention, it is possible to provide a novel laminate and a novel image display device which have a gas barrier function and a polarization conversion function and have a reduced thickness as compared to those in the related art.

DESCRIPTION OF THE PREFERRED EMBODIMENTS

Figure 1:
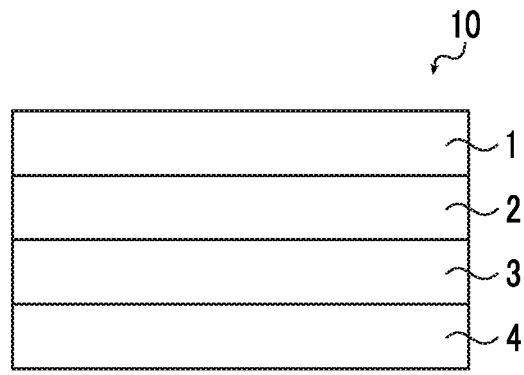
FIG. 1 is a schematic cross-sectional view illustrating an exemplary embodiment of a laminate of the invention.

Hereinafter, the invention will be described in detail.

Although the following description regarding the configuration requirements is based on representative embodiments of the invention, the invention is not limited to the embodiments.

In this specification, the numerical value ranges represented using "to" mean ranges including numerical values before and after "to" as a lower limit value and an upper limit value.

In this specification, the term "polarizing plate" means a plate in which a polarizing plate protective layer or a functional layer is disposed on at least one surface of a polarizer, and is used distinctively from a polarizer.

In this specification, the terms "parallel" and "perpendicular" encompass not only being parallel and perpendicular in the strict sense but also a range of ±50 from being parallel or perpendicular, respectively.

In this specification, the term "λ/4 plate" means a retardation plate in which an in-plane retardation is approximately ¼ of the wavelength. Specifically, λ/4 plate is a retardation plate in which an in-plane retardation Re (550) at a wavelength of 550 nm is 110 nm to 160 nm.

The term "λ/2 plate" means a retardation plate in which an in-plane retardation is approximately ½ of the wavelength. Specifically, a λ/2 plate is a retardation plate in which an in-plane retardation Re (550) at a wavelength of 550 nm is 220 nm to 320 nm.

In this specification, the expression "substantially has no in-plane retardation" does not mean that the in-plane retardation is 0, but means that the in-plane retardation is almost 0. Specifically, the above expression means that an in-plane retardation Re (550) at a wavelength of 550 nm is 10 nm or less.

Specifically, the expression "has an in-plane retardation" means that an in-plane retardation Re (550) at a wavelength of 550 nm is greater than 10 nm.

In this specification, the term "C-plate" means a retardation plate in which an in-plane retardation Re (550) is 10 nm or less and which has a thickness-direction retardation. A C-plate having a negative retardation in a thickness direction is a "positive C-plate", and a C-plate having a positive retardation in a thickness direction is a "negative C-plate". In this specification, Re (λ) and Rth (λ) represent an in-plane retardation and a thickness-direction retardation at a wavelength λ, respectively. Re (λ) is measured by making light with a wavelength of λ nm enter a film in a normal direction of the film in KOBRA 21ADH or KOBRA WR (all manufactured by Oji Scientific Instruments). A measurement wavelength λ nm can be selected by manually replacing a wavelength selective filter, or the measured value can be converted by using a program or the like for measurement.

Here, in a case where the film to be measured is one represented by a uniaxial or biaxial index ellipsoid, Rth (λ) is calculated by the following method.

Rth (λ) is calculated as follows: Re (λ) is measured at six points in total by making light with a wavelength of λ nm enter in directions inclined at intervals of 10 degrees up to 50 degrees on one side with respect to the normal direction of the film, as a slow axis (judged by KOBRA 21ADH or KOBRA WR) in the plane serves as an inclined axis (rotational axis) (in a case where there is no slow axis, an arbitrary direction in the film plane serves as a rotational axis); and then Rth (λ) is calculated by KOBRA 21ADH or KOBRA WR, based on the retardation values measured, an assumed value of the average refractive index, and a film thickness value that has been input.

In the above description, in a case of a film in which a slow axis in the plane from the normal direction serves as a rotational axis and there is a direction in which the retardation value is zero at a certain inclined angle, a minus sign is imparted to the retardation value at an inclined angle greater than the certain inclined angle, and then the calculation is carried out by KOBRA 21ADH or KOBRA WR.

Additionally, with a slow axis serving as an inclined axis (rotational axis) (in a case where there is no slow axis, an arbitrary direction in the film plane serves as a rotational axis), the retardation values may be measured in relation to two arbitrary inclined directions, and then Rth (λ) may be calculated from the following Formulae (1) and (2) based on the retardation values, an assumed value of the average refractive index, and a film thickness value that has been input.

$$Re(\theta) = \left[ nx - \frac{ny \times nz}{\sqrt{\left\{ ny \sin\left(\sin^{-1}\left(\frac{\sin(-\theta)}{nx}\right)\right)\right\}^2 + \left\{ nz \cos\left(\sin^{-1}\left(\frac{\sin(-\theta)}{nx}\right)\right)\right\}^2}} \right] \times \frac{d}{\cos\left\{\sin^{-1}\left(\frac{\sin(-\theta)}{nx}\right)\right\}}$$

Formula (1)

$$Rth = \left(\frac{nx + ny}{2} - nz\right) \times d$$

Formula (2)

In the formulae, Re (θ) denotes a retardation value in a direction inclined at an angle of θ from the normal direction. nx denotes a refractive index in the slow axis direction in the plane, ny denotes a refractive index in a direction perpendicular to nx in the plane, and nz denotes a refractive index in a direction perpendicular to nx and ny. d denotes a film thickness.

In a case where the film to be measured cannot be represented by a uniaxial or biaxial index ellipsoid, in other words, has no optic axis, Rth (λ) is calculated by the following method.

Rth (λ) is calculated as follows: Re (λ) is measured at eleven points by making light with a wavelength of λ nm enter in directions inclined at intervals of 10 degrees from −50 degrees to +50 degrees with respect to the normal direction of the film, as a slow axis (judged by KOBRA 21ADH or KOBRA WR) in the plane serves as an inclined axis (rotational axis); and then Rth (λ) is calculated by KOBRA 21ADH or KOBRA WR, based on the retardation values measured, an assumed value of the average refractive index, and a film thickness value that has been input.

In the above description, as the assumed value of the average refractive index, values mentioned in Polymer Handbook (JOHN WILEY & SONS, INC) or in the catalogues of various optical films can be used. Regarding an optical film of which the value of the average refractive index is unknown, the value can be measured using an Abbe refractometer. The values of the average refractive indices of major optical films are shown below as examples: cellulose acylate (1.48), cycloolefin polymer (1.52), polycarbonate (1.59), polymethyl methacrylate (1.49), and polystyrene (1.59). By inputting the assumed value of the average refractive index and the film thickness, KOBRA 21ADH or KOBRA WR calculates nx, ny and nz. Based on nx, ny and nz that have been calculated, Nz=(nx−nz)/(nx−ny) is calculated.

<Laminate>

A laminate of the invention is a laminate which has a substrate, an inorganic layer, an alignment film, and an organic layer in this order, and in which the organic layer contains a liquid crystal compound.

Hereinafter, exemplary embodiments of the laminate of the invention will be described using FIGS. 1, 2A, and 2B.

A laminate 10 illustrated in FIG. 1 has a substrate 1, an inorganic layer 2, an alignment film 3, and an organic layer 4 in this order. The organic layer 4 includes a liquid crystal compound.

The laminate of the invention has both of a gas barrier function and a polarization conversion function. Accordingly, the laminate is reduced in thickness as compared to those in the related art having a gas barrier film and a polarizing plate laminated separately by a thickness of the polarizing plate or the gas barrier film.

The polarization conversion function includes not only a circular polarization conversion function which is used to suppress the reflection of outdoor daylight, but also a polarization conversion function for optical compensation of the image display device.

Figure 2A:
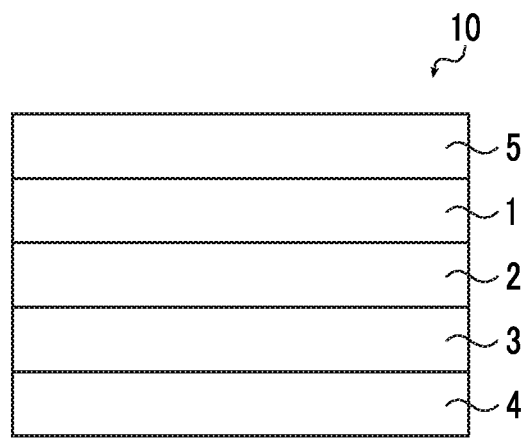
FIG. 2A is a schematic cross-sectional view illustrating an exemplary embodiment of the laminate of the invention.

In another embodiment of the laminate of the invention, as illustrated in FIG. 2A, a polarizer 5 is further provided on a side of a substrate 1 opposite to an inorganic layer 2. Hereinafter, in this specification, this embodiment may be referred to as Embodiment 2-A.

Figure 2B:
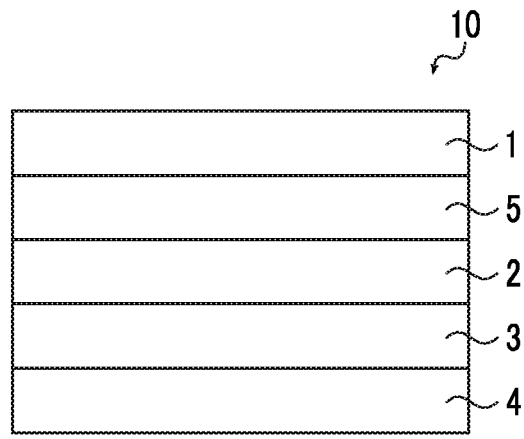
FIG. 2B is a schematic cross-sectional view illustrating an exemplary embodiment of the laminate of the invention.

In a further embodiment of the laminate of the invention, as illustrated in FIG. 2B, a polarizer 5 is further provided between a substrate 1 and an organic layer 4. Hereinafter, in this specification, this embodiment may be referred to as Embodiment 2-B.

<Image Display Device>

An image display device of the invention is an image display device which has a sealing material and an image display element in this order from the visible side, and uses the laminate of the invention as the sealing material.

In the invention, the sealing material may be any one of a laminate in which the substrate is disposed on the visible side and a laminate in which the substrate is disposed on the image display element side. However, since the influence of the retardation of the substrate can be reduced, a laminate in which the substrate is disposed on the visible side, that is, a laminate having a substrate, an inorganic layer, an alignment film, and an organic layer in this order from the visible side is preferable.

Hereinafter, exemplary embodiments of the image display device of the invention will be described using FIG. 3.

Figure 3:
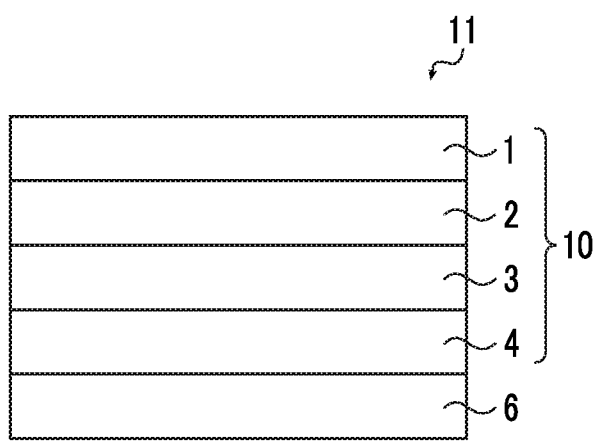
FIG. 3 is a schematic cross-sectional view illustrating an exemplary embodiment of an image display device of the invention.

An image display device 11 illustrated in FIG. 3 has a laminate 10 having a substrate 1, an inorganic layer 2, an alignment film 3, and an organic layer 4 in this order, and an image display element 6. The organic layer 4 includes a liquid crystal compound.

The laminate 10 of the invention functions as a sealing material of the image display element 6.

Hereinafter, members which are used in the invention will be described in detail.

[Substrate]

As the substrate which is used in the invention, a substrate which is usually used in a barrier film or a polarizing plate can be used, and specific examples thereof include glass and a polymer film.

Specific examples of the polymer film include a cellulose acylate film (for example, a cellulose triacetate film, a cellulose diacetate film, a cellulose acetate butyrate film, and a cellulose acetate propionate film); a polyolefin-based resin film such as polyethylene and polypropylene; a polyester-based resin film such as polyethylene terephthalate (PET) and polyethylene naphthalate; a polyethersulfone film; a polyacrylic resin film such as polymethyl methacrylate; a polyurethane-based resin film; a polycarbonate film; a polysulfone film; a polyether film; a polymethyl pentene film; a polyether ketone film; a (meth)acrylonitrile film; a polyimide film, a polyamide film; a polymer film having an alicyclic structure (for example, a norbornene-based resin film such as ARTON (manufactured by JSR Corporation)); and an amorphous polyolefin (for example, cycloolefin polymer such as ZEONEX (manufactured by ZEON Corporation)) film.

An embodiment in which a polarizer to be described later also serves as the substrate may be employed.

{Retardation of Substrate}

In Embodiment 2-A of the invention, outdoor daylight enters the substrate through the polarizer, and thus the retardation of the substrate has an influence on this embodiment. That is, the retardation of the substrate is preferably controlled.

In a case where the polarization conversion function is secured only with the organic layer, the influence of the retardation of the substrate is preferably reduced. It is preferable that a substrate substantially having no retardation is used, or even in a case where a substrate having a retardation is used, the influence of the retardation of the substrate is reduced by making the slow axis direction of the substrate parallel to the absorption axis or the transmission axis of the polarizer, that is, by adjusting an angle formed between the slow axis direction of the substrate and the absorption axis direction or the transmission axis direction of the polarizer to −5° to +5°.

A polarization conversion function may be imparted by the combination with an organic layer.

Specific examples of the combination include a combination in which the retardation of the substrate is λ/2 and the retardation of the organic layer is λ/4 to provide a broadband λ/4 plate; a combination in which the retardation of the substrate is λ/4 and the retardation of the organic layer is as in a C-plate; and a combination in which the retardation of the substrate is as in a C-plate and the retardation of the organic layer is λ/4.

In Embodiment 2-B of the invention, outdoor daylight enters the polarizer through the substrate, and thus the retardation of the substrate has no influence. That is, it is not necessary to control the retardation of the substrate.

In many cases, PET has been used as a substrate of a gas barrier film in view of price and the like. However, since PET has a large retardation, the polarization conversion function is eliminated due to the strong influence of the retardation of PET in a case where PET is directly used in combination with a circular polarizing plate.

In Embodiment 2 of the invention, it is possible to use a substrate having a large retardation such as PET which has been used, since the retardation of the substrate has no influence.

[Inorganic Layer]

The inorganic layer which is used in the invention is not particularly limited, and various known inorganic layers can be used. As the material of the inorganic layer, various known materials can be used as long as these can be used in the inorganic layer of the gas barrier film. Specific examples thereof include inorganic compounds such as metal oxides such as aluminum oxide, magnesium oxide, tantalum oxide, zirconium oxide, titanium oxide, and indium tin oxide (ITO); metal nitrides such as aluminum nitride; metal carbides such as aluminum carbide; silicon oxides such as silicon oxide, silicon oxide nitride, silicon oxycarbide, and silicon oxide nitride carbide; silicon nitrides such as silicon nitride and silicon nitride carbide; silicon carbides such as silicon carbide; hydrides of these materials; mixtures of two or more types of these materials; and hydrogen-containing materials of these materials.

Particularly, at least one inorganic compound selected from the group consisting of silicon nitride, silicon oxide, silicon oxynitride, and aluminum oxide is preferable due to its high transparency and compactness. Among these, silicon nitride is particularly preferable since it is more compact and has higher transparency.

The method of manufacturing an inorganic layer is not particularly limited, and various known methods can be used.

Among these, it is preferable that an inorganic layer is produced by vapor-depositing an inorganic compound. In a case where the lamination is performed by vapor deposition, as well as a surface serving as a vapor deposition surface, an organic layer having an optical function can serve as a vapor deposition surface as long as its function is not impaired.

{Thickness of Inorganic Layer}

The thickness of the inorganic layer which is used in the invention is not particularly limited. The thickness is preferably 10 nm or greater from the viewpoint of the gas barrier property. In addition, the thickness is preferably 200 nm or less from the viewpoint of breaking and cracks.

[Alignment Film]

As the alignment film which is used in the invention, various known alignment films can be used, and specifically, an alignment film obtained by rubbing polyvinyl alcohol (PVA), a photo-alignment film, or the like can be appropriately selected in accordance with a target alignment state of the liquid crystal compound.

A silane coupling agent and the like are preferably used in a composition for an alignment film from the viewpoint of improvement in adhesiveness in a case where the alignment film is formed on the inorganic layer.

As the silane coupling agent, silane coupling agents which have been known can be used without particular limitations. Examples thereof include epoxy group-containing silane coupling agents such as γ-glycidoxypropyltrimethoxysilane, γ-glycidoxypropyltriethoxysilane, γ-glycidoxypropylmethyldiethoxysilane, 2-(3,4-epoxycyclohexyl)ethyltrimethoxysilane, amino group-containing silane coupling agents such as 3-aminopropyltrimethoxysilane, N-2-(aminoethyl)-3-aminopropylmethyltrimethoxysilane, and 3-triethoxysilyl-N-(1,3-dimethylbutylidene)propylamine, (meth)acrylic group-containing silane coupling agents such as 3-acryloxypropyltrimethoxysilane and 3-methacryloxypropyltriethoxysilane, and isocyanate group-containing silane coupling agents such as 3-isocyanatepropyltriethoxysilane.

[Organic Layer]

The organic layer which is used in the invention is not particularly limited as long as it is an organic layer containing a liquid crystal compound. In this specification, the expression "contains a liquid crystal compound" includes not only a low-molecular-weight state before polymerization, but also a state in which liquid crystallinity is lost by polymerization and curing.

The method of producing the organic layer which is used in the invention is not particularly limited. For example, the organic layer can be produced by coating the inorganic layer with a composition containing a liquid crystal compound, an alignment agent, a leveling agent, other additives, and a solvent.

The method of applying the composition is not particularly limited, and known conventional methods such as a spin coating method, a gravure printing method, a flexographic printing method, an ink jet method, a die coating method, a slit die coating method, a cap coating method, and dipping can be performed.

<<Liquid Crystal Compound>>

The liquid crystal compound which is used in the invention is not particularly limited, and various known liquid crystal compounds can be used in accordance with target optical characteristics.

In general, liquid crystal compounds can be classified into a rod-like type and a disc-like type in accordance with the shape thereof. In addition, each type includes a low-molecular-weight type and a polymer type. In general, a polymer has a polymerization degree of 100 or greater (polymer physics/phase transition dynamics, written by Masao DOI, p. 2, Iwanami shoten, 1992). In the invention, any liquid crystal compound can be used, but a rod-like liquid crystal compound (nematic liquid crystal compound, smectic liquid crystal compound, cholesteric liquid crystal compound) or a disc-like liquid crystal compound (discotic liquid crystal compound) is preferably used. Two or more types of rod-like liquid crystal compounds, two or more types of disc-like liquid crystal compounds, or a mixture of a rod-like liquid crystal compound and a disc-like liquid crystal compound may be used. For fixing of the above-described liquid crystal compound, a rod-like liquid crystal compound or a disc-like liquid crystal compound having a polymerizable group is more preferably used for formation, and a liquid crystal compound having two or more polymerizable groups in one molecule is even more preferable. In a case where the liquid crystal compound is a mixture of two or more types, at least one type of liquid crystal compound preferably has two or more polymerizable groups in one molecule.

As the rod-like liquid crystal compound, for example, those described in claim 1 of JP1999-513019A (JP-H11-513019A) or paragraphs [0026] to [0098] of JP2005-289980A can be preferably used, and as the discotic liquid crystal compound, for example, those described in paragraphs [0020] to [0067] of JP2007-108732A or paragraphs [0013] to [0108] of JP2010-244038A can be preferably used. However, the compounds are not limited thereto.

<<Alignment Agent>>

Examples of the alignment agent include compounds (horizontal alignment agents) represented by Formulae (1) to (3) described in paragraphs [0253] to [0292] of JP2011-237513A, and the contents thereof are cited in this specification.

<<Leveling Agent>>

As the leveling agent, leveling agents for a coating material, such as a fluorine-based nonionic surfactant, a special acrylic resin-based leveling agent, and a silicone-based leveling agent, can be used.

<<Solvent>>

Specific examples of the solvent include ketones (for example, acetone, 2-butanone, methyl isobutyl ketone, cyclopentanone, and cyclohexanone), ethers (for example, dioxane and tetrahydrofuran), aliphatic hydrocarbons (for example, hexane), alicyclic hydrocarbons (for example, cyclohexane), aromatic hydrocarbons (for example, toluene, xylene, and trimethylbenzene), halogenated carbons (for example, dichloromethane, dichloroethane, dichlorobenzene, and chlorotoluene), esters (for example, methyl acetate, ethyl acetate, and butyl acetate), water, alcohols (for example, ethanol, isopropanol, butanol, and cyclohexanol), cellosolves (for example, methyl cellosolve and ethyl cellosolve), cellosolve acetates, sulfoxides (for example, dimethyl sulfoxide), and amides (for example, dimethylformamide and dimethyl acetamide). These may be used alone or in combination of two or more types thereof.

{Retardation of Organic Layer}

The retardation of the organic layer which is used in the invention is not particularly limited. For use in suppressing the reflection of outdoor daylight, the overall laminate may have a circular polarization conversion function. Specifically, retardations of the combinations exemplified in Retardation of Substrate, including an in-plane retardation set to λ/4, are exemplified. In addition, for use in optical compensation of the image display device, the organic layer may have a retardation according to the optical compensation form.

The retardation of the organic layer preferably has reciprocal wavelength dispersibility such that the circular polarization conversion can be more securely achieved at each wavelength. In this specification, the term "reciprocal wavelength dispersibility" means that the wavelength dispersibility represented by Re (450)/Re (550) is less than 1.

{Thickness of Organic Layer}

The thickness of the organic layer which is used in the invention is not particularly limited. The thickness is preferably 50 nm to 2000 nm in view of the balance between a desired retardation and the performance of the organic layer as a gas barrier film.

[Polarizer]

The polarizer which is used in the invention is not particularly limited, and it may be a so-called linear polarizer having a function of converting natural light into specific linearly polarized light. The polarizer is not particularly limited, and an absorption-type polarizer can be used.

{Material of Polarizer}

The material of the polarizer which is used in the invention is not particularly limited, and a polarizer which is usually used can be used. For example, any one of an iodine-based polarizer, a dye-based polarizer using a dichroic dye, and a polyene-based polarizer can be used.

Particularly, in a case where the inorganic layer is vapor-deposited after the polarizer is disposed on the substrate, a dye-based polarizer using a thermotropic liquid crystal dichroic pigment having excellent heat resistance is preferably used so as to withstand high temperatures during vapor deposition.

The method of producing a dye-based polarizer using a thermotropic liquid crystal dichroic pigment is not particularly limited. For example, a polarizer can be produced by forming an alignment film on a substrate and by then applying a composition containing a thermotropic liquid crystal dichroic pigment, an alignment agent, a leveling agent, other additives, and a solvent.

Here, regarding the alignment agent, the leveling agent, and the like other than the thermotropic liquid crystal dichroic pigment to be described later, and the method of applying the composition, those similar to those described in the above-described Organic Layer are exemplified.

<Thermotropic Liquid Crystal Dichroic Pigment>

As the thermotropic liquid crystal dichroic pigment which is used in the invention, for example, thermotropic liquid crystal dichroic pigments described in JP2011-237513A can be suitably used.

{Glass Transition Temperature of Polarizer}

The glass transition temperature of the polarizer which is used in the invention is not particularly limited. The glass transition temperature is preferably 120° C. or higher for withstanding high temperatures during vapor deposition in a case where the inorganic layer is vapor-deposited after the polarizer is disposed.

{Thickness of Polarizer}

In the invention, the thickness of the polarizer is not particularly limited. The thickness is preferably 3 μm to 60 μm, more preferably 5 μm to 30 μm, and even more preferably 5 μm to 15 μm.

{Method of Producing Laminate}

The method of producing the laminate which is used in the invention is not particularly limited. Examples thereof include a method of producing layers one by one by coating or vapor deposition on a substrate.

[Image Display Element]

The image display element which is used in the invention is not particularly limited, and a liquid crystal display element, an EL display element such as an organic EL or an inorganic EL, or the like can be used.

Specifically, the image display device of the invention can be obtained by using the laminate which is used in the invention as a sealing material which is usually used.

In the invention, the effect of the invention is increased in a case where an organic EL display element is used as an image display element in view of the fact that a light-emitting element is sensitive to oxygen, hydrogen, and the like, and internal reflection is easy to occur therein due to the structure of electrodes and the like.

Specifically, an embodiment in which the laminate which is used in the invention is used in place of a glass substrate on the light extraction side in an organic EL display element is exemplified.

EXPLANATION OF REFERENCES

1: substrate
2: inorganic layer
3: alignment film
4: organic layer
5: polarizer
6: image display element
10: laminate
11: image display device

What is claimed is:

1. A laminate comprising, in the following order:
a substrate;
an inorganic layer;
an alignment film; and
an organic layer,
wherein the organic layer contains a liquid crystal compound, wherein the organic layer has a retardation, wherein the laminate further comprises a linear polarizer which is provided on a side of the substrate opposite to the inorganic layer, wherein the substrate has an in-plane retardation, and the organic layer is a λ/4 plate, and wherein an angle formed between a slow axis direction of the substrate and an absorption axis direction of the linear polarizer is −5° to +5°.

2. The laminate according to claim 1, wherein the inorganic layer contains at least one inorganic compound selected from the group consisting of silicon nitride, silicon oxide, silicon oxynitride, and aluminum oxide.

3. An image display device comprising, in the following order from a visible side:

a sealing material; and an image display element, wherein the sealing material is the laminate according to claim 2.

4. An image display device comprising, in the following order from a visible side:

a sealing material; and an image display element, wherein the sealing material is the laminate according to claim 1, and wherein the image display element is an electroluminescence display element.

5. The image display device according to claim 4, wherein the electroluminescence display element is an organic electroluminescence display element.

6. The laminate according to claim 1, wherein the substrate and the inorganic layer are in contact with each other.

\* \* \* \* \*